United States Patent [19]

Pavone et al.

[11] 4,439,261

[45] Mar. 27, 1984

[54] COMPOSITE PALLET

[75] Inventors: Peter J. Pavone; Richard D. Van Demark, both of Wappingers Falls, N.Y.

[73] Assignee: International Business Machines Corporation, Armonk, N.Y.

[21] Appl. No.: 526,745

[22] Filed: Aug. 26, 1983

[51] Int. Cl.³ .............................................. C23F 1/02
[52] U.S. Cl. .................................... 156/345; 156/643; 204/298
[58] Field of Search ..................... 156/345, 643, 646; 204/192 E, 298; 118/728, 620; 427/38, 39

[56] References Cited

U.S. PATENT DOCUMENTS

| | | | |
|---|---|---|---|
| 3,423,303 | 1/1969 | Davidse et al. | 204/192 |
| 3,971,684 | 7/1976 | Muto | 156/13 |
| 4,209,357 | 6/1980 | Gorin et al. | 156/643 |
| 4,238,312 | 12/1980 | Galicki et al. | 204/298 |
| 4,268,374 | 5/1981 | Lepselter | 156/345 X |
| 4,283,249 | 8/1981 | Ephrath | 156/643 |
| 4,350,578 | 9/1982 | Frieser et al. | 204/192 R |
| 4,367,114 | 1/1983 | Steinberg et al. | 156/345 |
| 4,397,724 | 8/1983 | Moran | 204/192 E |
| 4,399,016 | 8/1983 | Tsukada et al. | 204/192 R |
| 4,400,235 | 8/1983 | Coquin et al. | 156/345 X |

OTHER PUBLICATIONS

C. J. Hendricks, "Cathode Plate for Backside Oxide Strip in an RIE Reactor", IBM Technical Disclosure Bulletin, vol. 23, No. 12, May 1981, pp. 5350–5351.
H. M. Gartner et al, "Achieving Uniform Etch Rates in Reactive Ion Plasma Etching Processes", IBM Technical Disclosure Bulletin, vol. 20, No. 7, Dec. 1977, p. 2703.

*Primary Examiner*—William A. Powell
*Attorney, Agent, or Firm*—T. Rao Coca

[57] ABSTRACT

Disclosed is a composite pallet for a reactive ion etching system consisting of an upper surface made of an insulative material, such as, silicon having therein a plurality of recessed pockets for holding the wafers to be etched and a bottom surface made of conductive material, such as, aluminum for electrically and thermally communicating the wafers with the cathode. The pallet diameter is larger than that of the cathode, but due to the conductive bottom surface the cathode is effectively extended over the entire pallet diameter. Such an arrangement provides excellent etch uniformity over all portions of the pallet.

11 Claims, 5 Drawing Figures

COMPOSITE PALLET

BACKGROUND OF THE INVENTION

This invention relates to a reactive ion etching (RIE) apparatus and, more particularly, to an improved pallet in electrical communication with the cathode therein for providing high etch uniformity across the entire pallet surface.

In the manufacture of semiconductor devices considerable interest exists in employing dry processing techniques for patterning workpieces such as semiconductor wafers. The interest in dry etching techniques stems from their generally better resolution and improved dimensional and shape control capabilities relative to etching using wet chemicals. Among the dry etching techniques, reactive ion etching has been favored, especially with ultrafine resolution demanded by devices of the very large scale integration (VLSI) type because of its compatibility to achieve high etch rates and extremely well-defined edges on etched materials.

The requirements for high volume handling of semiconductor wafers has resulted in the use of multiple wafer batch RIE systems. In order to enhance the throughput and to simultaneously process a large number of wafers without human intervention the RIE systems have been automated. In an automated RIE system the wafers are automatically transported, loaded, processed and unloaded.

The RIE system typically consists of a container wherein are positioned an anode and a cathode. The cathode is negatively biased relative to the anode by means of a radio frequency (RF) potential. The surface to be etched is covered by the suitable mask and then placed directly on the cathode or on a pallet which is electrically and mechanically connected to the cathode. A chemically reactive gas such as $CF_4$ is introduced into the container maintained at a pressure, typically, in the millitorr range. The electric field established in the region between the anode and the cathode will dissociate the reactive gas forming a plasma therein. Chemically reactive gas ions in the plasma are attracted to the cathode and thereby impinge on the surface to be etched. Apparently, the surface is etched both by chemical interaction with the active ions and by the momentum transfer of the ions striking the surface. By virtue of the electric field attracting the ions to the cathode, the ions strike the surface to be etched predominantly in a direction perpendicular to the surface so that the process produces well-defined vertically etched side walls.

In order to maximize the etch rates and effectiveness of etching, the gaseous plasma is generally confined to the small reaction volume between the cathode and the anode. One way of accomplishing this relatively small reaction volume is by utilizing a flat disc-shaped cathode and a cylindrical cap-shaped anode covering the cathode and electrically insulated from the cathode. In this arrangement, since the cathode diameter is smaller than the anode diameter the inside walls of the cylindrical anode is spaced from the cathode plate. Consequently, although the electric field in the central portion of this reaction volume is uniform and perpendicular to the cathode surface, the field along the outer edge areas of the cathode varies with radial position and is not perpendicular to the cathode surface. As a result of the nonuniformity in the electric field in the reaction volume to etch rate of wafers placed at various radial positions on the cathode is not uniform, the etch rate at the center of the cathode being greater than that at the outer edge. Also, since the electric field along the outer edge of the cathode is not perpendicular to the cathode surface, the etch profile of the wafers placed along the outer edge is poor.

A similar lack of uniformity in the etch rate and absence of consistently well-defined edges on etched materials occurs in automated RIE systems which utilize a pallet typically made of silicon for transporting the wafers into or out of the reaction volume. The pallet diameter is required to be somewhat larger than the diameter of the cathode in order that, for example, at the termination of the etching process, the pallet may be gently lifted up from the cathode and carried out of the process chamber by the transfer carrier. In this removable pallet RIE arrangement, since the pallet's diameter is larger than that of the cathode, the electric field is uniform and perpendicular to the pallet surface only over the portion of the pallet that is in direct contact with (or overlaps) the cathode and within approximately 1 inch from the cathode's perimeter. In other words, the electric field along the ring portion of the pallet from the pallet's outer edge to approximately 1 inch interior to the cathode's outer edge is nonuniform and the field lines are inclined at various angles. As a result of this variation of electric field strength and direction, the etch rate of the wafers mounted along the outer edge of the pallet is nonuniform and the profiles of their etched surfaces unacceptably poor.

It would appear that one solution to the above problem is to mount a metallic plate on the cathode thereby extending the cathode as illustrated in FIG. 1 of U.S. Pat. No. 4,283,249 which is assigned to IBM Corporation, the present assignee. Such an arrangement, although extends the area of the cathode over which the electric field is uniform and perpendicular to the cathode surface, suffers from sputtering of the cathode material (even at very low power densities) which will diffuse back on the surfaces being etched and introduce defects therein. Another disadvantage is the so-called loading problem created in the reaction volume due to the inability of the metal cathode to maintain a uniform and high density of reactive ion species.

Another solution is repositioning the wafers to be etched toward the center of the pallet/cathode or, alternatively, improving the electric field in the pallet/cathode edge areas so that the field is perpendicular to the cathode/pallet surface. However, both these approaches require extensive modification, particularly in the case of fixed automated handling RIE systems, which is prohibitively expensive, to maintain the high throughput demanded of such systems.

Accordingly, it is an object of this invention to provide a RIE apparatus which allows an enhanced etch uniformity across the workpiece.

It is a further object of this invention to provide a RIE apparatus which enables excellent etch uniformity across the entire cathode surface.

It is still another object of this invention to provide a RIE apparatus which enables excellent etch uniformity over the entire batch of workpieces which are in electrical communication with the cathode therein without introducing contaminants into the etched workpieces.

SUMMARY OF THE INVENTION

The above objects and other related objects and advantages may be achieved through the use of a novel RIE apparatus herein disclosed. In one illustrated preferred embodiment of this invention, an automated RIE apparatus is provided wherein the carrier transports a pallet having a plurality of wafers thereon to and from a wafer load/unload area outside the RIE chamber. The RIE cathode is disc-shaped and the anode is cap-shaped to envelope the cathode and form an enclosed reaction volume therebetween. The anode is fixed in the RIE chamber, and the cathode is movable with respect to the anode. The pallet is a disc-shaped composite structure having a diameter greater than the cathode diameter in order for the carrier to remove the pallet from the cathode. The composite pallet consists of a top insulating layer for holding a plurality of semiconductor wafers thereon and the bottom conducting layer which is bonded to the top layer such that when the pallet is placed on the cathode, the bottom conducting layer forms an extension of the cathode over the entire pallet diameter to achieve uniform reactive ion etching on all portions of the pallet. In one example, the top insulating layer of the pallet is silicon and the bottom conducting layer is a conductive metal such as aluminum.

BRIEF DESCRIPTION OF THE DRAWINGS

The novel features and elements characteristic of the invention are set forth in the appended claims. The invention itself, however, will be best understood by reference to the detailed description which follows in conjunction with the accompanying drawings, wherein:

DETAILED DESCRIPTION OF PREFERRED EMBODIMENT

Figure 1:
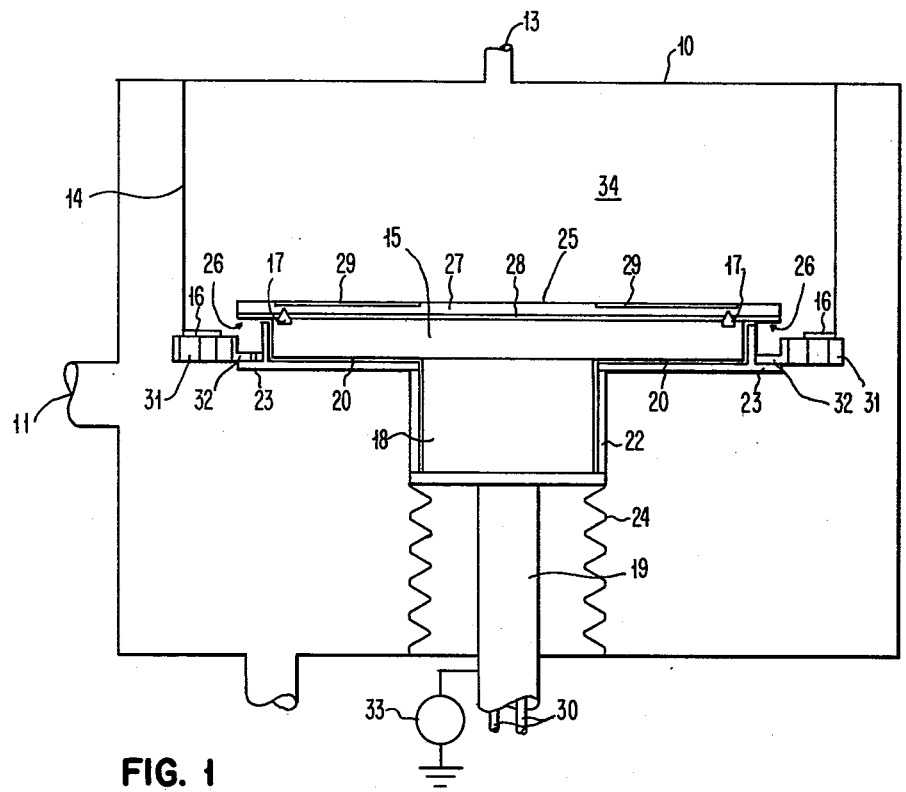
FIG. 1 shows a schematic sectional view of a specific illustrative automated RIE apparatus in accordance with the principles of the present invention.
Figure 1A:
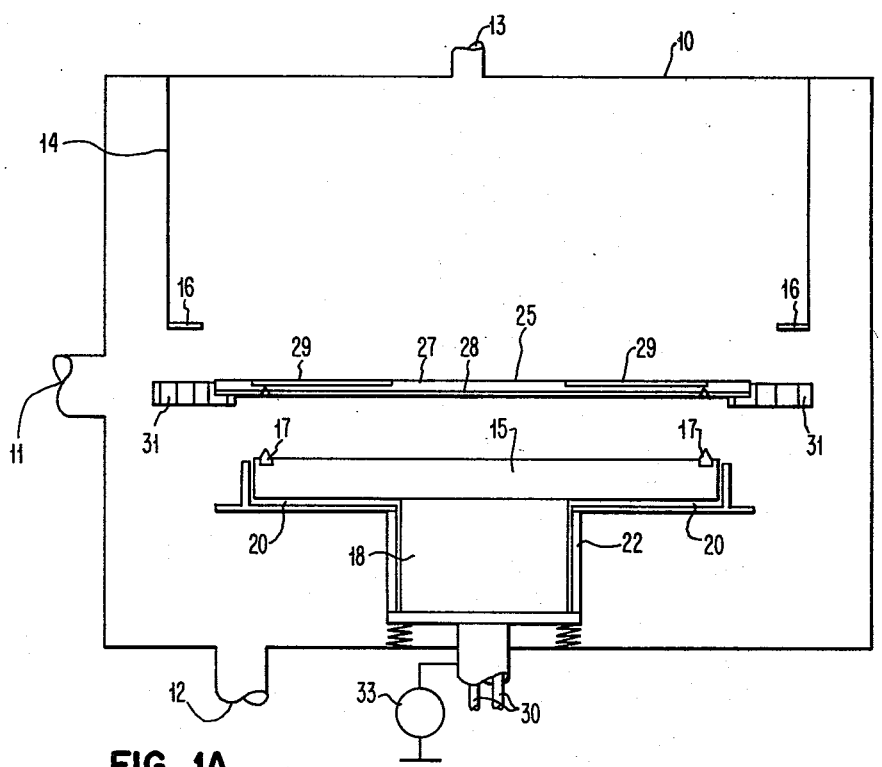
FIGS. 1A and 1B are schematic sectional views of the RIE apparatus of FIG. 1 at different stages of operation.
Figure 1B:
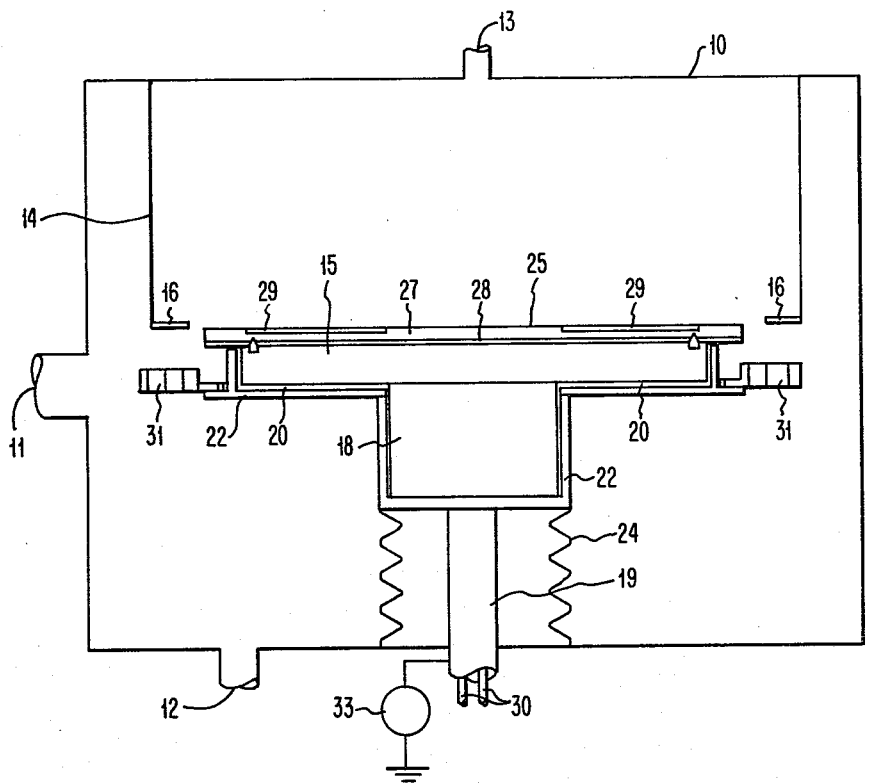

The specific illustrative RIE apparatus shown in FIGS. 1, 1A, and 1B comprises a process chamber 10 consisting of a slit valve opening 11 through which wafers are automatically transported into or out of the process chamber. Chamber 10 is of suitable mechanical construction which permits it to be pumped down to a high vacuum via outlet 12. The process chamber 10 is also fitted with a gas inlet port 13 which is connected to multiple sources of various gases which are used in etching for controlled introduction of a suitable process gas into the chamber. Within the chamber 10 is an anode 14 and a cathode 15. The anode 14 is shaped in the form of a cylinder which is open at the bottom and closed at the top except for a small opening in correspondence with the gas inlet 13 in chamber 10. The bottom end of the anode 14 is provided with an inwardly extending lip 16. The anode 14 is made of a conductive material such as stainless steel and is mechanically attached to the process chamber 10 in the inside portion thereof.

The cathode 15 is positioned opposite the anode 14 and is shaped in the form of a flat circular disc. The cathode 15 is preferably a radio frequency electrode made of an electrically conductive material which is not reactive to the etching process. Suitable cathode materials include stainless steel and copper. The cathode 15 is provided with two pins 17 (shown clearly in FIG. 1A) in a diametrically opposite arrangement for accurately positioning the pallet relative to the cathode.

In contrast with the anode 14 which is fixed, cathode 15 is movable in the vertical direction in relation to the anode. This is accomplished by means of a block 18 which is rigidly attached to the cathode 15 at the top end and to an activating device for raising/lowering 19 at the bottom end via a conductive cladding material 22. In order to prevent the cathode RF from being applied to the activating device 19, block 18 is made of and insulative material, for example, a ceramic material. The conductive cladding material 22 encases the block 18. This conductive casing 22 functions as the ground shield for the cathode and prevents ionization of the gas under the cathode and also serves to contain the plasma in the region between the cathode and the anode. The conductive casing 22 is provided with a lip 23 protruding outwardly therefrom. The cathode 15 is physically separated from the conductive casing 22 by a gap identified by numeral 20 in FIGS. 1A and 1B to prevent an electrical short between the cathode 15 and casing 22. The bottom end of casing 22 is attached to a metal bellows 24 which is capable of compression and expansion in accordance with lowering and raising, respectively, of the cathode 15. Bellows 24 essentially serves to preserve vacuum integrity inside the process chamber 10. The bellows 24 is typically made of stainless steel.

Figure 2:
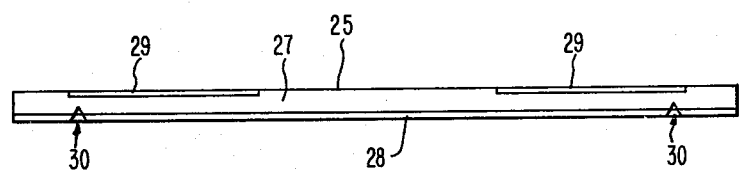
FIG. 2 is a cross-sectional view of the composite pallet in accordance with the present invention.

In accordance with the principles of the present invention, multiple wafers to be etched are mounted on a position-indexed pallet 25. The pallet 25, typically, is disc-shaped having a diameter larger than that of the cathode 15. The pallet 25 diameter is required to be larger than that of the cathode so that the pallet can be lowered onto a carrier 31 by utilizing the ring-shaped portion 26 of the pallet which overhangs the cathode 15 for transportation into/out of the process chamber 10. Referring to FIG. 2, in a preferred embodiment the pallet 25 has a composite structure consisting of a face plate 27 made of a non-conductive material and a bottom plate 28 made of a conductive material which is firmly attached to the face plate 27. In a preferred embodiment face plate 27 is made of silicon and the bottom plate is made of aluminum. The face plate 27 contains a plurality of recessed pockets 29 (typically about 8) for receiving the wafers to be etched. The depth of the recesses 29 is approximately the same as the thickness of the wafers. The pallet 27 is provided with pin holes 30—30 at the bottom portion thereof which mate with the cathode pins 17—17. By mating the pin holes 30—30 with pins 17—17 in this manner, not only proper alignment of the pallet 27 with the cathode 15 but also accurate positioning of the wafers with respect to the cathode are ensured.

The composite pallet 25 may be constructed in several ways. One approach is to evaporate a conductive metal on the backside of a silicon face plate. Another technique is to bond a metal base plate to a silicon face plate by means of a grease used in high-vacuum systems and sold under the trade name Apiezon by Apiezon Products Limited, London, England.

The vacuum grease mentioned hereinabove may also be applied to the underside of the composite pallet 25 to insure excellent thermal conductivity between pallet 25 and cathode 15.

Thus, all the wafers positioned in the recesses 29, regardless of their position, are in thermal contact with the pallet 25 which, in turn, is in thermal contact with cathode 15 via the base plate 28.

The cathode 15 and, by virtue of excellent thermal contact that exists between the composite pallet 25 and the cathode 15, the pallet 25 are cooled by circulating water through the conduit 30. Cooling of wafers mounted on the pallet 25 is advantageous. Otherwise, heat generated during the etching process may cause material included on the wafer (e.g. photoresist) to flow and thereby deleteriously alter the geometry of the device being fabricated. Moreover, by controlling the temperature of the wafers to maintain a specified optimal temperature on the surfaces thereof, a relatively uniform and efficient etching action is achieved for materials whose etch rates are temperature dependent.

The process chamber 10 also contains a carrier or tray 31 which is used to carry the pallet 25 during transportation of the composite pallet 25 into or out of the chamber 10. Carrier 31 is provided with a circular central opening and a circular protrusion 32 on the inside bottom portion thereof. The circular protrusion 32 forms a recessed circular pocket in carrier 31 having a diameter greater than that of the central opening therein. The diameter of the recessed pocket in the carrier 31 is slightly larger than the diameter of the composite pallet 25 so that the pallet 25 will rest on the ring-shaped protrusion 32 and will be below or in flux with the upper surface of carrier 31 while being transported. The carrier is typically made of stainless steel and may be provided with pins (not shown) for properly aligning the pallet 25 therewith.

The carrier 31 and composite pallet 25 combination is transported by a frame (not shown) into/out of the process chamber 10.

An RF power supply 33 is used to effectively negative-bias cathode 15 with respect to anode 14.

Having described the sailient features of the RIE apparatus of the invention, the operation of the apparatus will now be briefly traced. With reference to FIGS. 1, 1A and 1B. The wafers to be etched are assembled on the composite pallet 25 so that each wafer occupies one recessed pocket 29. This assembly is generally accomplished outside the process chamber 10. The carrier 31-pallet 25 combination is then transported via the slit valve opening 11 into the process chamber 10 as shown in FIG. 1A such that the carrier-pallet combination is positioned between the fixed anode 14 and the movable cathode 15 shown in the "down" position. Once the carrier 31 and pallet 25 are properly positioned between the anode and the cathode, the cathode 15 is raised by means of the activating device 19 such that the cathode pins 17—17 engage the pin holes 30—30 in the pallet 25. Further raising of the cathode will lift the pallet 25 off the carrier protrusion 32 and also engage the cathode casing lip 23 with the carrier 31 as shown in FIG. 1B. Upon further raising of the cathode to a totally "up" position (FIG. 1), the cathode casing lip 23 will raise the carrier 31 so that it is fully engaged with the circular anode lip 16. In this "up" position, the anode 14 in combination with the carrier 31 and cathode casing 22–23 will form a reaction volume 34 for the wafers.

To etch quartz (i.e. silicon dioxide) films deposited on the silicon wafer, for example, a suitable etchant gas such as $CF_4$ mixed with some oxygen is introduced into the reaction volume via the gas inlet port 13. Oxygen is used to accelerate the etching process and also prevent the accumulation of carbon deposits resulting from chemical interaction of $CF_4$ with the metallized anode 14, carrier 32, etc. Once the necessary low pressure in the millitorr range is maintained in the reaction volume 34, RF power supply 33 is turned on to effectively negative-bias the cathode 15 and thereby the conductive composite pallet 25 with respect to the anode 14. Due to a fixed distance between the cathode 15 and the ceiling of the anode 14 and since the pallet 25 by virtue of the metallic base plate 28 effectively extends the cathode 15 to a diameter corresponding to that of the pallet 25 an essentially uniform vertical electric field is established in the region between the cathode and the anode. Consequently, positive $CF_3$ ions from the reactive plasma are attracted toward the cathode in a vertical direction. Some of the ions so attracted will impinge on the wafers to chemically interact to etch away areas not covered by a mask. Since the electric field is uniform and is in a vertical direction, the etch rates over the entire pallet surface will be uniform and the etched surfaces will have a well-defined vertically etched wall profile.

Figure 3:
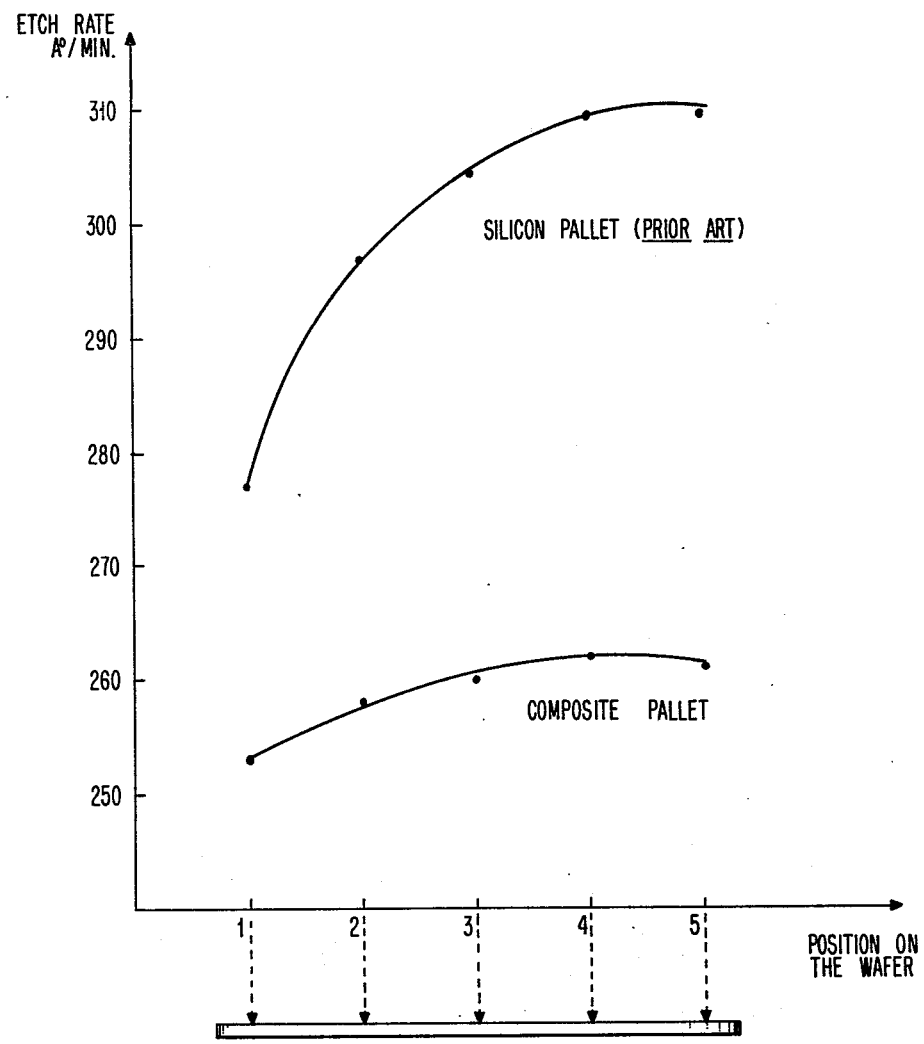
FIG. 3 is a graphical representation of etch rate versus position on a wafer when etching a quartz coating on the wafer using a conventional RIE apparatus and the RIE apparatus in accordance with this invention.

The etch rate uniformity over the wafer obtained by means of the present invention is compared with the etch rate obtained by the prior art RIE apparatus using a silicon pallet in the graphical illustrations shown in FIG. 3. In both cases, the inner diameter of the anode 14 and the cathode 15 diameter were the same, they being approximately 17.75 inches and 13.25 inches, respectively. The diameter of the prior art silicon pallet and that of the subject composite pallet were also the same, approximately 15.25 inches. The thickness of the prior art silicon pallet and the present composite pallet were also the same, namely, approximately 0.25 inches except that the composite pallet was provided, in addition, with an approximately 0.005 inch thick bottom layer of aluminum. The wafer etching was accomplished utilizing a power of about 275 watts and a process gas pressure in the reaction volume of about 20 microns and a process gas flow rate of 5–6 SCCM. The etch rate was monitored using a laser system which vertically illuminated the position on the wafer being monitored and measured the reflected light. An analog to digital converter and a digital processor coupled to the laser provided automatic signal processing.

In FIG. 3 is shown the quartz etch rate as a function of position on the silicon wafer. The data shown is representative of one of the batch of eight 82 mm wafers mounted (in the recessed pockets) in the pallet in a circular arrangement. The etch rate in FIG. 3 is the data corresponding to wafers mounted in the same recessed pocket (pocket 7). Location 1 on the wafer corresponds to a point close to the edge of the pallet and location 5 corresponds to a point close to the center of the pallet.

It is evident from FIG. 3 that there is a significant variation in the quartz etch rate across the wafer in the case of the RIE apparatus fitted with the conventional silicon pallet. The etch rate toward the edge of the pallet (corresponding to location 1) is significantly (approximately 33Å per minute) lower than that toward the center (corresponding to location 5). In contrast, using a composite pallet according to the invention, with conditions otherwise the same as in the prior art RIE apparatus, the etch rate variation across the pallet is minimal (less than 10Å per minute).

The difference in etch rates between the prior art apparatus and the invention for locations toward the center of the pallet (e.g. locations 4 and 5) is attributed to the difference in power densities as a result of the difference in the effective cathode area in the two cases. In the prior art apparatus, the power density is higher since the RF potential is applied over a smaller area, i.e. the area of the pallet which is in direct contact and in an overlapping relationship with the cathode.

In addition to the excellent etch uniformity along a given radial line on composite pallet noted above (FIG. 3), the 3σ etch uniformity for the wafer, based on data over 19 locations on the wafer, was less than 7 percent which was substantially lower than the 3σ uniformity value of 18 percent obtained with the prior art apparatus. A similar 3σ etch uniformity value for the whole batch of wafers was seen.

In summary, the composite pallet, when incorporated in an RIE apparatus, provides excellent etch rate uniformity not only across each wafer surface but also over all wafers mounted on the pallet and electrically communicated with the cathode. This excellence in etch rate uniformity is due to the conductive bottom surface provided on the pallet which effectively extends the cathode's electrical potential to the pallet's extremeties and thereby forms an electric field which is essentially perpendicular to and uniform over the entire pallet surface. Since the top surface of the pallet is made of silicon, the excellent etch rate ratio characteristic of silicon is preserved.

Thus, there has been provided, in accordance with the invention, an improved RIE apparatus that fully satisfies the objects and advantages set forth above.

While the invention has been described in conjunction with a specific preferred embodiment, it is evident that many alternatives, modifications and variations will be apparent to those skilled in the art in light of the foregoing description. While the apparatus has been described in conjunction with the etching of quartz films it is adaptable for etching of a variety of materials by properly selecting reactant gases, power levels, pressure and etch temperature. It is therefore contemplated that the appended claims will embrace any such alternatives, modifications and variations as fall within the true scope and spirit of the invention.

We claim:

1. A reactive ion etching system comprising:
   a vessel;
   a disc-shaped cathode within said vessel, said cathode being connected to a radio frequency source; and
   a disc-shaped pallet including a top insulating layer for holding a plurality of semiconductor wafers thereon, and a bottom conducting layer, the diameter of said pallet being greater than the diameter of the cathode and said pallet bottom conducting layer being adjacent said cathode and electrically connected thereto,
   whereby said bottom conducting layer is an extension of said cathode over the entire pallet diameter to achieve uniform reactive ion etching on all portions of the pallet.

2. A reactive ion etching system comprising:
   a vessel;
   a disc-shaped cathode within said vessel, said cathode being connected to a radio frequency source;
   a disc-shaped pallet including a top insulating layer for holding a plurality of semiconductor wafers thereon, and a bottom conducting layer, the diameter of said pallet being greater than the diameter of said cathode; and
   means for conveying said pallet into said vessel and loading said pallet onto said cathode with said bottom conducting layer adjacent said cathode and electrically connected thereto,
   whereby said bottom conducting layer is an extension of said cathode over the entire pallet's diameter to achieve uniform reactive ion etching on all portions of the pallet.

3. The reactive ion etching system as recited in claims 1 or 2 wherein said top insulating layer is silicon.

4. The reactive ion etching system as recited in claims 1 or 2 wherein said bottom conducting layer is aluminum.

5. The reactive ion etching system as recited in claims 1 or 2 wherein the ratio of said pallets' diameter to said cathode diameter is approximately 1.1.

6. The reactive ion etching system as recited in claim 5 wherein the ratio of the thickness of the bottom conducting layer to the thickness of the top insulating layer is approximately less than or equal to 1.

7. A reactive ion etching apparatus comprising:
   a vessel;
   a flat disc-shaped cathode within said vessel, said cathode being connected to a radio frequency source;
   a flat disc-shaped metal-silicon composite pallet including a top silicon layer having thereon a plurality of recessed pockets for holding semiconductor wafers, and a bottom conductive metal layer, the diameter of said pallet being greater than the diameter of said cathode; and
   means for conveying said pallet into said vessel and loading said pallets onto said cathode with said bottom conductive layer adjacent said cathode and electrically connected thereto,
   whereby said bottom conductive layer is an extension of said cathode over the entire pallets to achieve uniform reactive ion etching on all portion of the pallet.

8. The reactive ion etching apparatus as recited in claim 7 further comprising a cap-shaped anode enveloping said pallet for establishing a uniform RF electric field and bounding a reaction volume between said pallet and said anode.

9. A pallet for transporting workpieces into or out of an automated reactive ion etching apparatus and for making electrical contact of said workpieces with the reactive ion etching apparatus cathode during reactive ion etching of said workpieces, said pallet comprising:
   a flat, disc-shaped electrically insulative face plate of a diameter larger than the diameter of said cathode, said face plate having a plurality of recessed pockets for receiving said workpieces; and
   an electrically conductive bottom plate of the same diameter as the face plate and securely bonded to said face plate for electrically communicating said workpieces with said cathode during reactive ion etching.

10. The pallet is recited in claim 9 wherein said insulative plate is fabricated from silicon and said bottom plate is fabricated from aluminum.

11. The pallet as recited in claim 10 wherein the thickness ratio of the bottom plate to the face plate is less than or equal to 1.

* * * * *